(12) United States Patent
Kim

(10) Patent No.: US 6,475,824 B1
(45) Date of Patent: Nov. 5, 2002

(54) X-RAY DETECTOR AND METHOD OF FABRICATING THE SAME

(75) Inventor: Chang Won Kim, Seoul (KR)

(73) Assignee: LG. Philips LCD Co., Ltd., Seoul (KR)

( * ) Notice: Subject to any disclaimer, the term of this patent is extended or adjusted under 35 U.S.C. 154(b) by 0 days.

(21) Appl. No.: 09/412,515

(22) Filed: Oct. 5, 1999

(30) Foreign Application Priority Data

Oct. 7, 1998 (KR) ............................................ 98-41814

(51) Int. Cl.[7] .......................... H01L 21/00; H01L 31/02
(52) U.S. Cl. ............................. 438/66; 438/64; 257/433
(58) Field of Search .............................. 438/57, 64, 66, 438/67, 73, 125, 126, 127; 257/443, 428, 431, 433, 444, 448; 250/370.01, 370.08, 370.09, 371

(56) References Cited

U.S. PATENT DOCUMENTS 5,043,582 A * 8/1991 Cox et al.
5,648,674 A * 7/1997 Weisfield et al. ...... 250/370.09

FOREIGN PATENT DOCUMENTS

JP       59003283 A * 1/1984

OTHER PUBLICATIONS

Yim et al., "Anisotropic Conductive Film (ACF) Interconnection for Display Packaging Applications", 1998 IEEE, Electronic Components and Technology Conference, pp. 1036–1041.*

* cited by examiner

Primary Examiner—Michael Sherry
Assistant Examiner—Evan Pert
(74) Attorney, Agent, or Firm—McKenna Long & Aldridge LLP

(57) ABSTRACT

An X-ray detector, which comprises a gate pad connected to a gate line disposed crosswise in a first direction, a data pad connected to a data line disposed lengthwise in a second direction substantially perpendicular to the first direction, a switching element disposed in the region where the gate line and the data line cross, a storage capacitor connected with the switching element on the same plane, and scanning and data integrated circuit chips for operating the switching element, is produced by a method which includes connecting an X-ray detector panel with the scanning and/or data integration chip by a tape carrier package and/or a chip-on-glass method. According to the invention, closely spaced terminals can be connected, the connection area can be decreased, and the processing time for making the connections can be reduced.

20 Claims, 3 Drawing Sheets

X-RAY DETECTOR AND METHOD OF FABRICATING THE SAME

BACKGROUND OF THE INVENTION

1. Field of the Invention

The present invention relates to an X-ray detector and methods of fabricating the same, and more particularly to the electrical connection between an X-ray detector panel and an integrated circuit chip of the X-ray detector.

2. Discussion of the Related Art

In an X-ray detector, a package connecting an external integrated circuit chip with the X-ray detector serves not only for electrical connection, but also for transmission of electrical signals, mechanical support and release of heat generated during operation. The importance of the package is increasing recently because the signal transmission speed of a chip is much higher than that of the package and the signal delay time in the package determines the efficiency of an X-ray detector.

The wire bonding method has been employed for packaging an X-ray detector, which is a method wherein a chip and a pad formed in a lead frame are connected by a wire such as Au, Al, etc. The wire bonding method is used, in general, with integrated circuit chips for a wide range of process conditions with good reliability. An example is illustrated in FIG. 1, where a gate line 3 or data line 4 of a TFT (thin film transistor) 2 is connected by a wire 6 with an integrated circuit 5 on an X-ray detector panel 1, and the integrated circuit 5 is also connected with a printed circuit board 7 by a wire 6.

However, the wire bonding method is a sequential connection method wherein connecting terminals are connected one by one. Therefore, it requires a long time when the number of connecting terminals is large, as in an X-ray detector, and connection is impossible where the distance between connecting terminals is very short. In addition, the connection area is undesirably large owing to the height of the wire loop.

SUMMARY OF THE INVENTION

Accordingly, the present invention is directed to an X-ray detector and a method of fabricating the same that substantially obviates one or more of the problems due to limitations and disadvantages of the related art.

An object of the present invention is to provide a method for fabricating an X-ray detector, whereby the time period required in the process of connecting an X-ray detector panel and a drive integrated circuit is shortened, and whereby a very short connection between connecting terminals becomes possible and the connection area is reduced.

Another object of the present invention is to provide an X-ray detector fabricated by such a method.

In order to achieve the above objects, the present invention provides in a first aspect, a method for fabricating an X-ray detector comprising a gate pad connected to a gate line disposed crosswise in a first direction, a data pad connected to a data line disposed lengthwise in a second direction substantially perpendicular to the first direction, a switching element disposed in the region where a gate line and a data line cross, a storage capacitor connected with the switching element, scanning and data integrated circuit chips for operating the switching element and a printed circuit board for driving the scanning and data integrated circuit chips, which comprises:

forming at least two protruding electrodes, or bumps, on the scanning integrated circuit chip;

providing a first polyamide film having an electrode adhered thereto, the electrode having an inner lead and an outer lead;

providing a second polyamide film having an electrode adhered thereto, the electrode having an inner lead and an outer lead;

bonding the inner leads of the first and the second polyamide films with the bumps, respectively;

bonding the outer lead of the first polyamide film to the gate pad with an anisotropic conducting film interposed therebetween; and connecting the outer lead of the second polyamide film to the printed circuit board by soldering.

In a second aspect, the present invention provides a method for fabricating an X-ray detector similar to that as described above, which comprises:

forming at least two bumps on the data integrated circuit chip;

providing a first polyamide film having an electrode adhered thereto, the electrode having an inner lead and an outer lead;

providing a second polyamide film having an electrode adhered thereto, the electrode having an inner lead and an outer lead;

bonding the inner leads of the first and the second polyamide films with the bumps, respectively;

bonding the outer lead of the first polyamide film to the data pad with an anisotropic conducting film interposed therebetween; and connecting the outer lead of the second polyamide film to the printed circuit board by soldering.

In the above methods according to a first mode (tape carrier package) of the invention, the switching element is preferably a thin film transistor.

The above methods may further comprise encapsulating the integrated circuit chip and the inner leads of the electrodes of the first and second polyamide film with a resin after bonding the inner leads of the first and second lead electrodes with the protruding conductor of the integrated circuit chip. An epoxy resin may be preferably used as the encapsulating resin.

In a third aspect, the present invention provides a method for fabricating an X-ray detector comprising first and second gate pads connected to first and second gate lines, respectively, each disposed crosswise in a first direction, first and second data pads connected to first and second data lines, respectively, each disposed lengthwise in a second direction substantially perpendicular to the first direction, a switching element disposed in a region where one of the gate lines and one of the data lines cross, a storage capacitor connected on a same plane with the switching element, and scanning and data integrated circuit chips for operating the switching element, which comprises:

providing a flexible printed circuit board for operating the scanning integrated circuit chip;

providing an anisotropic conductive film;

forming on the scanning integrated circuit chip first and second protruding conductors;

bonding the first gate pad with the first protruding conductor on the scanning integrated circuit chip;

bonding the second gate pad with the second protruding conductor on the scanning integrated circuit chip; and bonding the flexible printed circuit board with the second gate pad by the anisotropic conductive film.

In a fourth aspect, the present invention also provides a method for fabricating an X-ray detector as described above, which comprises:

providing a flexible printed circuit board for operating a data integrated circuit chip;

providing an anisotropic conductive film;

forming on the data integrated circuit chip first and second protruding conductors;

bonding the first data pad with the first protruding conductor on the data integrated circuit chip;

bonding the second data pad with the second protruding conductor on the data integrated circuit chip; and bonding the flexible printed circuit board with the second data pad by the anisotropic conductive film.

In the above methods according to a second mode of the invention (chip-on-glass method), the switching element is preferably a thin film transistor.

In a fifth aspect, the present invention also provides an X-ray detector fabricated according to the first and second modes set forth above.

Additional features and advantages of the invention will be set forth in the description, which follows, and in part will be apparent from the description, or may be learned by practice of the invention. The objectives and other advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWING

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Preferred embodiments of the invention will be described in detail hereinafter, referring to FIGS. 2 to 4.

A first mode of the present invention adapts the tape carrier package method to the process of manufacturing an X-ray detector. Tape carrier packaging was generally introduced initially by General Electric Co., in the U.S. in the 1960s and has been greatly developed after the 1980s. According to this method, a chip is electrically and mechanically connected to a panel using a tape with fine circuit lines. The method includes an inner lead bonding process, an encapsulation process and an outer lead bonding process. As shown in FIG. 2, the tape carrier used in this method includes first and second polyamide films 20a and 20b each having an inner lead and an outer lead attached thereto.

In the inner lead bonding process, heat energy and pressure bond the chip and the inner lead of the tape carrier. The encapsulation process forms a film of an epoxy-type resin that protects the chip and the inner lead from the surrounding environment, after the inner lead bonding process. The outer lead bonding process connects the outer lead to a pad formed on a printed circuit board, after an electrical test following the encapsulation process.

Figure 1:
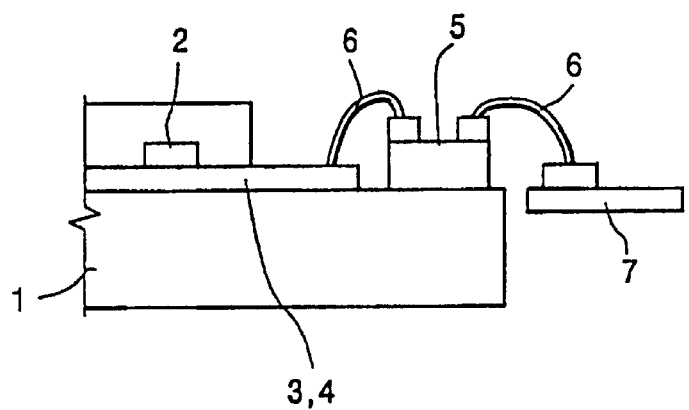
FIG. 1 is a cross-sectional view of an enlarged scale illustrating the Wire Bonding method, where an X-ray detector panel and an integrated circuit are connected each other by a wire.
Figure 2:
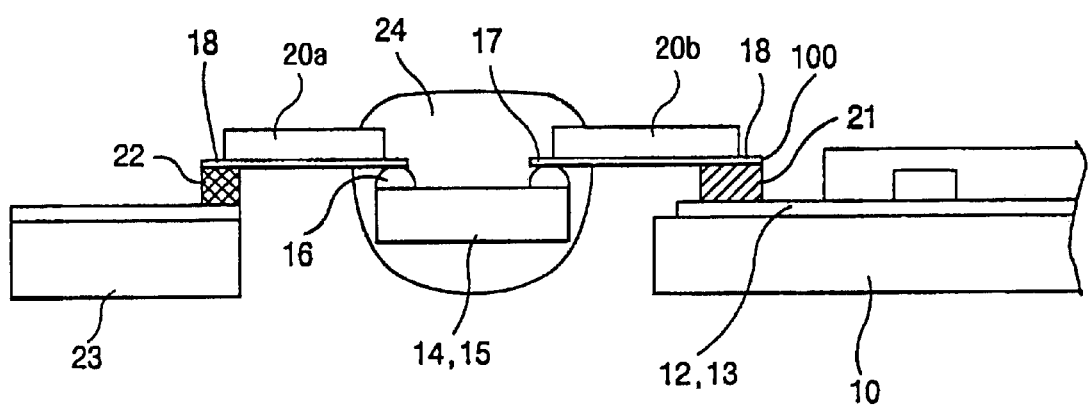
FIG. 2 is a cross-sectional view of an enlarged scale illustrating one embodiment of the present invention wherein an X-ray detector panel and an integration circuit are connected each other according to first mode (tape carrier package) of the present invention.

FIG. 2 illustrates a partial cross-section of an X-ray detector fabricated using the tape carrier package method in accordance with the first mode of the present invention.

As illustrated in FIG. 2, a plurality of copper foils 100 in a striped pattern are adhered to each of two polyamide films 20a and 20b, each foil having an inner lead 17 and an outer lead 18. The inner lead 17 is provided for connection to a scanning integrated circuit chip 14 or a data integrated circuit chip 15. The outer lead 18 is provided for connection to a gate pad 12 or a data pad 13 on the X-ray detector panel 10, or for connection to a printed circuit board 23.

Before connecting the inner lead 17 to the chip 14 or 15, it is necessary to form a protruding electrode or bump 16 on the chip 14 or 15 in advance.

The inner lead 17 and the bump 16 are bonded with pressure and heat, and the inner lead 17 and the chip 14 or 15 are encapsulated with a resin protective film 24.

An anisotropic conducting film 21 is used to connect the outer lead 18 to the gate pad 12 or data pad 13 on the X-ray detector panel 10. A soldering contact 22 is used to connect the outer lead 18 to the printed circuit board 23.

Figure 3:
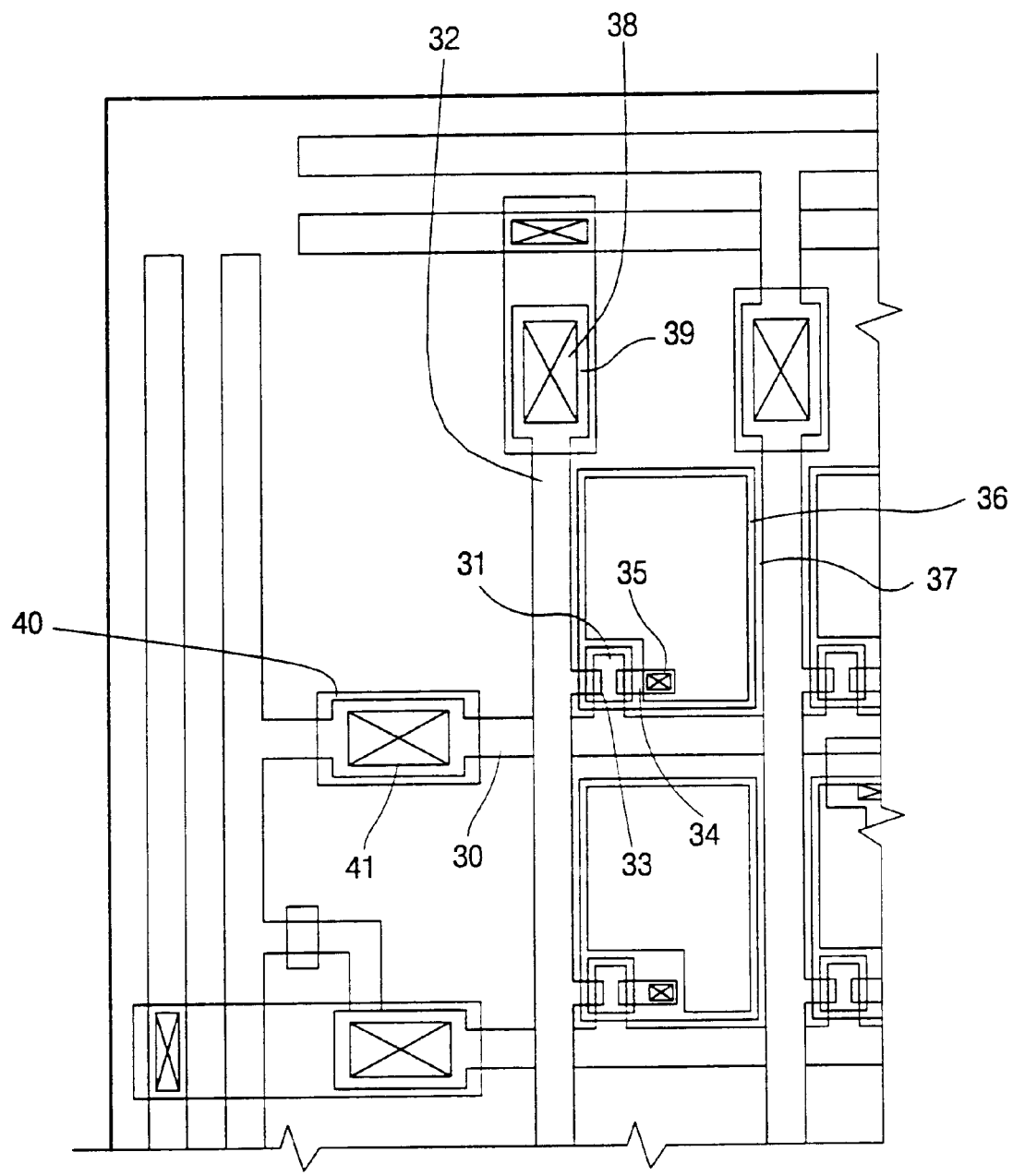
FIG. 3 is a plan view of an enlarged scale illustrating a marginal section of an X-ray detector containing a gate pad and data pad.

FIG. 3 shows a gate line 30, gate electrode 31, data line 32, source electrode 33, drain electrode 34, common electrode 36 and pixel electrode 37, gate pad 40 and its contact hole 41, and data pad 38 and its contact hole 39.

Although only part of a panel is illustrated and total line distribution cannot be seen, FIG. 3 shows that a gate line 30 is disposed crosswise and a gate electrode 31 is connected to each gate line, and in the upper position, a data line 32 is disposed lengthwise and a source electrode 33 is connected to each data line. A drain electrode 34 is disposed facing the source electrode 33 to constitute a thin film transistor.

The drain electrode 34 has a contact hole 35 to connect with the common electrode 36, and a pixel electrode 37 is disposed in the upper position of the TFT to constitute a storage capacitor together with the common electrode 36.

The storage capacitor receives X-ray radiation and collects electron-hole pairs produced in a photosensitive material (not illustrated) and stores them in the pixel electrode 37. A scanning integrated circuit chip (not illustrated) transmits a scanning signal to the gate line 30 thereby to sequentially apply a voltage on a gate electrode 31. A data integrated circuit chip (not illustrated) applies a voltage on a data line 32 crossing the selected gate electrode 31, enabling the charges stored in the storage capacitor to flow outside through the contact hole 35 of the drain electrode 34.

In order to transmit a scanning signal to the gate line 30 and make electric charges stored in the storage capacitor flow to an external data integrated circuit chip, preferably a gate pad 40 for the gate line 30 and the scanning integration circuit 14 are connected with each other according to the method shown in FIG. 2, and a data pad 38 for the data line 32 is connected with the data integrated circuit chip 15 by the same method. Alternatively, either of the connections may be accomplished by the chip-on-glass method disclosed below.

For the alignment and connection of a data pad 38 connected to the data line 32 according to the first mode described above, description is not given here because it is substantially the same as explained above.

Now, the second mode of the present invention, which adapts the chip-on-glass method to attach an integrated circuit to an X-ray panel, is described.

While in the tape carrier package method, an integrated circuit chip is mounted on a film, in the chip-on-glass method an external scanning integrated circuit chip or data integrated circuit chip is mounted directly on a panel to form a connection therebetween.

According to this method, a protruding electrode or conductor called a "bump" in the form of a hemisphere is formed on the aluminum electrode part of an integrated circuit chip, and then the integrated circuit chip is placed such that the bump faces the connecting terminal of a panel, and both are connected with each other by heating with pressure. With this method, it is possible to form a plurality of bumps on the total surface of a chip and to establish all of the connections at the same time irrespective of the number of bumps, which enables high-density connection and mounting in a short time. Automation of this method is easy because the bump tends to place itself in a correct position by the action of surface tension when the bump is melted by heating.

Figure 4:
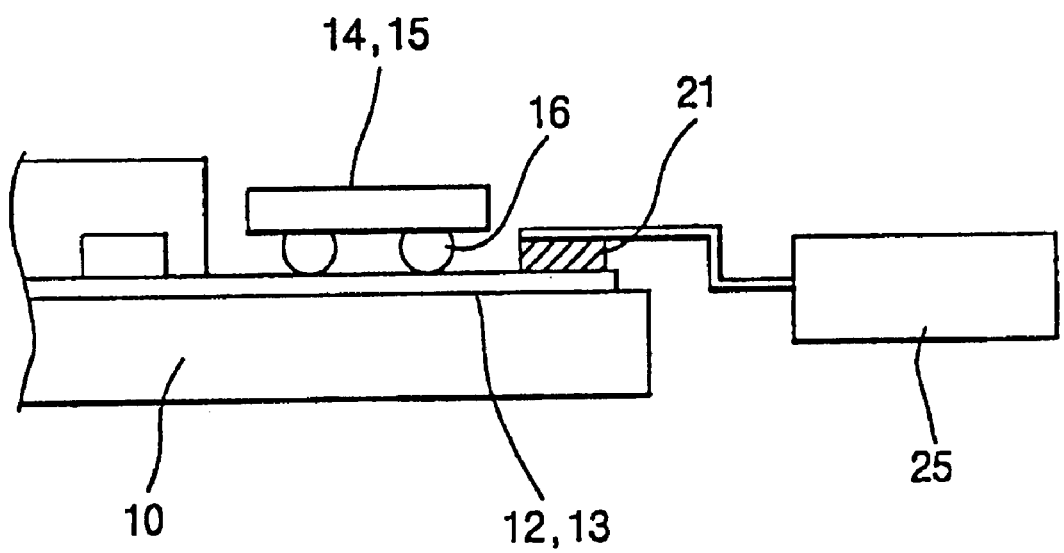
FIG. 4 is a cross-sectional view of an enlarged scale illustrating another embodiment of the present invention wherein an X-ray detector panel and an integrated circuit are connected to each other according to a second mode (chip-on-glass method) of the present invention.

Referring to FIG. 4, a bump 16 is shown which has been formed on a scanning integrated circuit chip 14 to connect it with the X-ray detector panel 10. The bump 16 is aligned with a gate pad 12 connected to a gate line 30 on the X-ray detector panel 10, and the bump 16 and gate pad 12 are adhered by heating. The scanning integrated circuit chip 14 may have a plurality of bumps 16, which may all be connected with a plurality of gate lines 30 on the X-ray detector panel 10 in this way. The integrated circuit chip 14 is thus connected to the X-ray detector panel 10 and therefore any other accessory, such as a tape carrier package, is not necessary in this method.

Also, the data integrated circuit chip 15 can be connected by the same method as the scanning integrated circuit chip 14, for the alignment and connection of data pad 13 connected to data line 32 via the chip-on-glass method is substantially the same as described above and is therefore not repeated.

After the connection of the integrated circuit chip 14 or 15, a flexible printed circuit board 25 is connected to the X-ray detector panel 10 by means of an anisotropic conductive film 21. The anisotropic conductive film 21 is a kind of thermosetting resin film containing conductive particles, and can establish an electrical connection in the vertical direction when heated with pressure after aligning the panel 10, flexible printed circuit board 25 and gate pad 12 or data pad 13.

As described in detail heretofore, the present invention employs the tape carrier package or chip-on-glass method in connecting together an X-ray detector panel and a scanning or data integrated circuit chip. According to the invention, a reduction in processing time and a productivity improvement are obtained.

In particular, the tape carrier package method can produce a light, thin and small package because it produces a package by connecting a scanning or data integration chip on a polymer film. Also, it can be used in extremely narrow pitch for high resolution and preciseness, and products made by it can be repaired easily.

The chip-on-glass method provides a stable connection and fine pitch connection because it mounts an integrated circuit chip directly on a detector panel and requires no additional components. Accordingly, cost reduction and a light product can be obtained, as well as good reliability.

It will be apparent to those skilled in the art that various modifications and variations can be made in the x-ray detector and method of fabricating the same of the present invention without departing from the spirit or scope of the invention. Thus, it is intended that the present invention covers the modifications and variations of this invention provided they come within the scope of the appended claims and their equivalents.

What is claimed is:

1. A method for fabricating an X-ray detector comprising a gate pad connected to a gate line disposed crosswise in a first direction, a data pad connected to a data line disposed lengthwise in a second direction substantially perpendicular to the first direction, a switching element disposed in the region where the gate line and the data line cross, a storage capacitor connected with the switching element, a scanning and a data integrated circuit chip for operating the switching element, and a printed circuit board for driving the scanning and data integrated circuit chips, said method comprising:

forming at least two protruding electrodes on the scanning integrated circuit chip;

bonding an inner lead of a first electrode adhered to a first polyamide film and a second electrode adhered to a second polyamide film, respectively, with the protruding electrodes on the scanning integrated circuit chip;

bonding an outer lead of the first electrode of the first polyamide film to the gate pad with an anisotropic conducting film interposed therebetween; and connecting an outer lead of the second electrode of the second polyamide film to the printed circuit board by soldering.

2. The method of claim 1, wherein the switching element is a thin film transistor.

3. The method of claim 1, further comprising encapsulating with a resin the scanning integrated circuit chip and the inner leads of the first and second electrodes of the first and second polyamide films, after bonding the inner leads of the first and second electrodes with the protruding electrodes of the scanning integrated circuit chip.

4. The method of claim 3, wherein the resin is an epoxy resin.

5. A method for fabricating an X-ray detector comprising a gate pad connected to a gate line disposed crosswise in a first direction, a data pad connected to a data line disposed lengthwise in a second direction substantially perpendicular to the first direction, a switching element disposed in a region where the gate line and the data line cross, a storage capacitor connected with the switching element on a same plane, and a scanning and a data integrated circuit chip for operating the switching element, said method comprising:

forming at least two protruding electrodes on the data integrated circuit chip;

bonding an inner lead of a first electrode to a first polyamide film and a second electrode adhered to a second polyamide film, respectively, with the protruding electrodes on the data integrated circuit chip;

bonding an outer lead of the first electrode of the first polyamide film to the data pad with an anisotropic conducting film interposed therebetween; and connecting an outer lead of the second electrode of the second polyamide film to the printed circuit board by soldering.

6. The method of claim 5, wherein the switching element is a thin film transistor.

7. The method of claim 5, which further comprises encapsulating with a resin the data integrated circuit chip and the inner leads of the first and second electrodes of the first and second polyamide films after bonding the inner leads of the first and second electrodes with the protruding electrodes of the data integrated circuit chip.

8. The method of claim 7, wherein the resin is an epoxy resin.

9. A method for fabricating an X-ray detector comprising first and second gate pads each connected to a gate line disposed crosswise in a first direction, first and second data pads each connected to a data line disposed lengthwise in a second direction substantially perpendicular to the first direction, a switching element disposed in a region where the gate line and the data lines cross, a storage capacitor connected with the switching element on a same plane, and a scanning and a data integrated circuit chip for operating the switching element, said method comprising:

forming on the scanning integrated circuit chip first and second protruding conductors;

bonding the first gate pad with the first protruding conductor on the scanning integrated circuit chip;

bonding the second gate pad with the second protruding conductor on the scanning integrated circuit chip; and bonding a flexible printed circuit board, for operating the scanning integrated circuit chip, with the second gate pad by means of an anisotropic conductive film.

10. The method of claim 9, wherein the switching element is a thin film transistor.

11. A method for fabricating an X-ray detector comprising first and second gate pads each connected to a gate line disposed crosswise in a first direction, first and second data pads connected respectively to a data line disposed lengthwise in a second direction substantially perpendicular to the first direction, a switching element disposed in a region where the gate line and the data line cross, a storage capacitor connected with the switching element on a same plane, and a scanning and a data integrated circuit chip for operating the switching element, said method comprising:

forming on the data integrated circuit chip first and second protruding conductors for bonding to the first and second data pads, respectively;

bonding the first data pad with the first protruding conductor on the data integrated circuit chip;

bonding the second data pad with the second protruding conductor on the data integrated circuit chip; and bonding a flexible printed circuit board for operating the data integrated circuit chip with the second data pad by means of an anisotropic conductive film.

12. The method of claim 11, wherein the switching element is a thin film transistor.

13. A method of manufacturing an X-ray detector device comprising a switching circuit connected with a storage capacitor and having a gate and a data line, and a scanning integrated circuit chip and a data integrated circuit chip each for operating the switching circuit, said method comprising:

forming a protruding electrode on the scanning integrated circuit chip;

bonding the protruding electrode on the scanning integrated circuit chip to a gate pad connected with the gate line of the switching circuit; and bonding a flexible printed circuit board for operating the scanning integrated circuit chip with the gate pad by means of an anisotropic conductive film.

14. The method of claim 13, further comprising:

forming a second protruding electrode on the data integrated circuit chip;

bonding the protruding electrode on the data integrated circuit to a data pad connected with the data line of the switching circuit; and bonding a second flexible printed circuit board for operating the scanning integrated circuit chip with the data pad by means of a second anisotropic conductive film.

15. An X-ray detector, comprising:

a switching circuit connected with a storage capacitor and having a gate line connected to a gate pad, and a data line connected to a data pad;

a scanning integrated circuit chip having at least two protruding electrodes;

a printed circuit board for operating the scanning integrated circuit;

a first polyamide film having a first electrode adhered thereto, the first electrode having an inner lead bonded to the first protruding electrode and an outer lead bonded to the gate pad with an anisotropic conducting film; and a second polyamide film having a second electrode adhered thereto, the second electrode having an inner lead bonded to the second protruding electrode and an outer lead connected to the printed circuit board by solder.

16. The X-ray detector of claim 15, further comprising a resin encapsulating the scanning integrated circuit chip and the inner leads of the first and second electrodes of the first and second polyamide films.

17. An X-ray detector, comprising:

a switching circuit connected with a storage capacitor and having a gate line connected to a gate pad, and a data line connected to a data pad;

a data integrated circuit chip having at least two protruding electrodes;

a printed circuit board for operating the data integrated circuit;

a first polyamide film having a first electrode adhered thereto, the first electrode having an inner lead bonded to the first protruding electrode and an outer lead bonded to the data pad; and a second polyamide film having a second electrode adhered thereto, the second electrode having an inner lead bonded to the second protruding electrode and an outer lead connected to the printed circuit board by solder.

18. The X-ray detector of claim 17, further comprising a resin encapsulating the scanning integrated circuit chip and the inner leads of the first and second electrodes of the first and second polyamide films.

19. An X-ray detector, comprising:

a switching circuit connected with a storage capacitor and having a gate line connected to first and second gate pads, and a data line connected to first and second data pads;

a scanning integrated circuit chip having at least two protruding electrodes each bonded respectively to the first and second gate pads; and a flexible printed circuit board for operating the scanning integrated circuit, connected to the second gate pad by an anisotropic conductive film.

20. An X-ray detector, comprising:

a switching circuit connected with a storage capacitor and having a gate line connected to first and second gate pads, and a data line connected to first and second data pads;

a data integrated circuit chip having at least two protruding electrodes each bonded respectively to the first and second data pads; and a flexible printed circuit board for operating the scanning integrated circuit, connected to the second data pad by an anistropic conductive film.

* * * * *